(12) United States Patent
Cariello et al.

(10) Patent No.: US 10,607,693 B2
(45) Date of Patent: Mar. 31, 2020

(54) MISPLACEMENT MITIGATION ALGORITHM

(71) Applicant: Micron Technology, Inc., Boise, ID (US)

(72) Inventors: Giuseppe Cariello, Boise, ID (US); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/023,052

(22) Filed: Jun. 29, 2018

(65) Prior Publication Data

US 2020/0005862 A1 Jan. 2, 2020

(51) Int. Cl.
*G11C 11/34* (2006.01)
*G11C 11/56* (2006.01)
*G11C 29/42* (2006.01)

(52) U.S. Cl.
CPC ...... *G11C 11/5628* (2013.01); *G11C 11/5642* (2013.01); *G11C 11/5671* (2013.01); *G11C 29/42* (2013.01); *G11C 2211/5621* (2013.01); *G11C 2211/5624* (2013.01); *G11C 2211/5631* (2013.01)

(58) Field of Classification Search
CPC ............ G11C 16/0483; G11C 11/5642; G11C 11/5628; G11C 16/26; G11C 16/10; G11C 2211/5621; G11C 16/3459; G11C 16/3454; G11C 16/28; G11C 16/349; G11C 2211/5642; G11C 16/3404
USPC ............ 365/185.03, 185.18, 185.17, 185.11, 365/185.2, 185.22, 185.21, 185.24, (Continued)

(56) References Cited

U.S. PATENT DOCUMENTS

2008/0158984 A1* 7/2008 Mokhlesi ............ G11C 11/5642
365/185.21
2014/0016411 A1 1/2014 Kawai et al.
(Continued)

OTHER PUBLICATIONS

"International Application Serial No. PCT/US2019/038272, International Search Report dated Oct. 8, 2019", 3 pgs.
(Continued)

*Primary Examiner* — Thong Q Le
(74) *Attorney, Agent, or Firm* — Schwegman Lundberg & Woessner, P.A.

(57) ABSTRACT

A memory device comprises a memory array and a memory control unit. The memory includes multi-level memory cells. The memory control unit is configured to: initiate programming of memory cells of the memory array using a first pass programming operation, wherein the first pass programming operation places programming data using a first and second voltage threshold distributions; read programmed memory cells using a first read voltage level on word lines of the memory cells; read the programmed memory cells using a second read voltage level on the word lines of the memory cells; determine a number of the programmed memory cells with a voltage threshold placed between the first and second voltage threshold distributions by the programming; and suspend second pass programming of the memory cells in response to the determined number of cells exceeding a specified threshold number, and initiate a second pass programming operation otherwise.

22 Claims, 9 Drawing Sheets

(58) Field of Classification Search
USPC ............ 365/185.25, 185.23, 185.08, 185.12, 365/185.14
See application file for complete search history.

(56) References Cited

U.S. PATENT DOCUMENTS

| | | |
|---|---|---|
| 2014/0063960 A1 | 3/2014 | Goda et al. |
| 2015/0131373 A1 | 5/2015 | Alhussien et al. |
| 2015/0340086 A1 | 11/2015 | Filipiak et al. |
| 2016/0284397 A1 | 9/2016 | Kim et al. |

OTHER PUBLICATIONS

"International Application Serial No. PCT/US2019/038272, Written Opinion dated Oct. 8, 2019", 4 pgs.

* cited by examiner

| Memory Cell 210, 285 | | | |
|---|---|---|---|
| | B2 | B1 | B0 |
| Vt$_7$ | 1 | 1 | 1 |
| Vt$_6$ | 1 | 1 | 0 |
| Vt$_5$ | 1 | 0 | 1 |
| Vt$_4$ | 1 | 0 | 0 |
| Vt$_3$ | 0 | 1 | 1 |
| Vt$_2$ | 0 | 1 | 0 |
| Vt$_1$ | 0 | 0 | 1 |
| Vt$_0$ | 0 | 0 | 0 |

MISPLACEMENT MITIGATION ALGORITHM

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Memory devices, particularly NVM devices, such as NAND flash devices, etc., can include arrays of multi-level memory cells. To program multi-level memory cells, a memory page buffer is stored with the value to be written to the memory cells. A first programming pulse is applied to the control gate of the memory cell at a voltage level that should not cause the threshold voltage of the memory cell to exceed the lowest threshold voltage of a target programmed data state of a multi-level memory cell. A read operation can then be performed to verify the threshold level to which the cell is programmed. If the cell is not programmed to the desired threshold voltage, an additional programming pulse, including optionally a higher voltage or longer length pulse, is applied and the threshold voltage is rechecked. This process is repeated until the read operation confirms that the memory cell is programmed to the desired threshold voltage. Due to different disturb mechanisms and memory cell defects, the threshold voltage of a memory cell may be incorrectly placed during programming.

Figure 1:
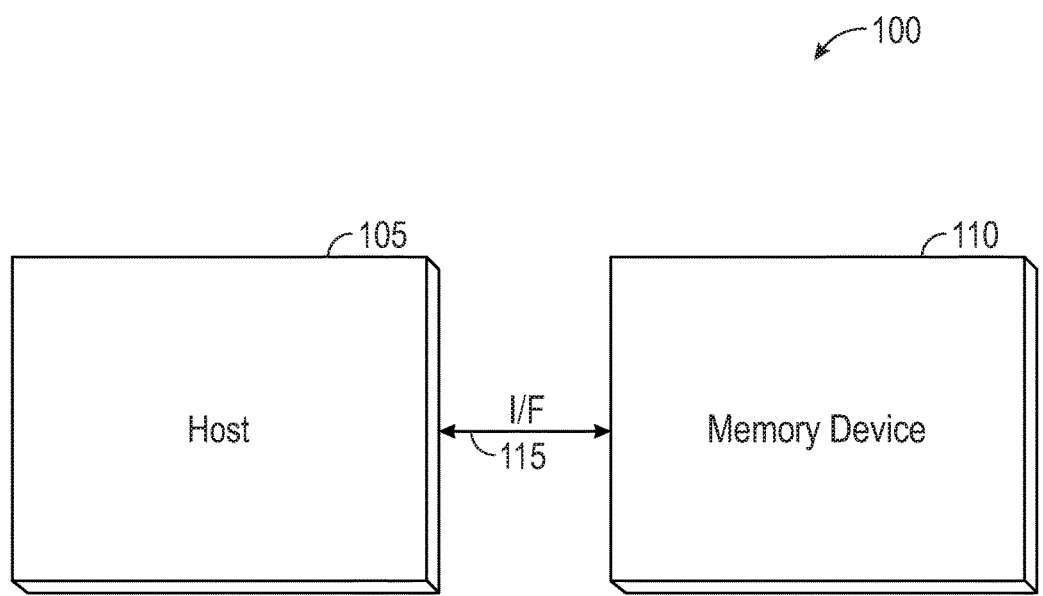
FIG. 1 illustrates an example system including a host and a memory device.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC device, and the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110. The identified standards are provided only as example environments in which the described methods and structures may be utilized; but such methods and structures may be utilized in a variety of environments outside of the identified standards (or of any actual or proposed standards).

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain embodiments, the memory array can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
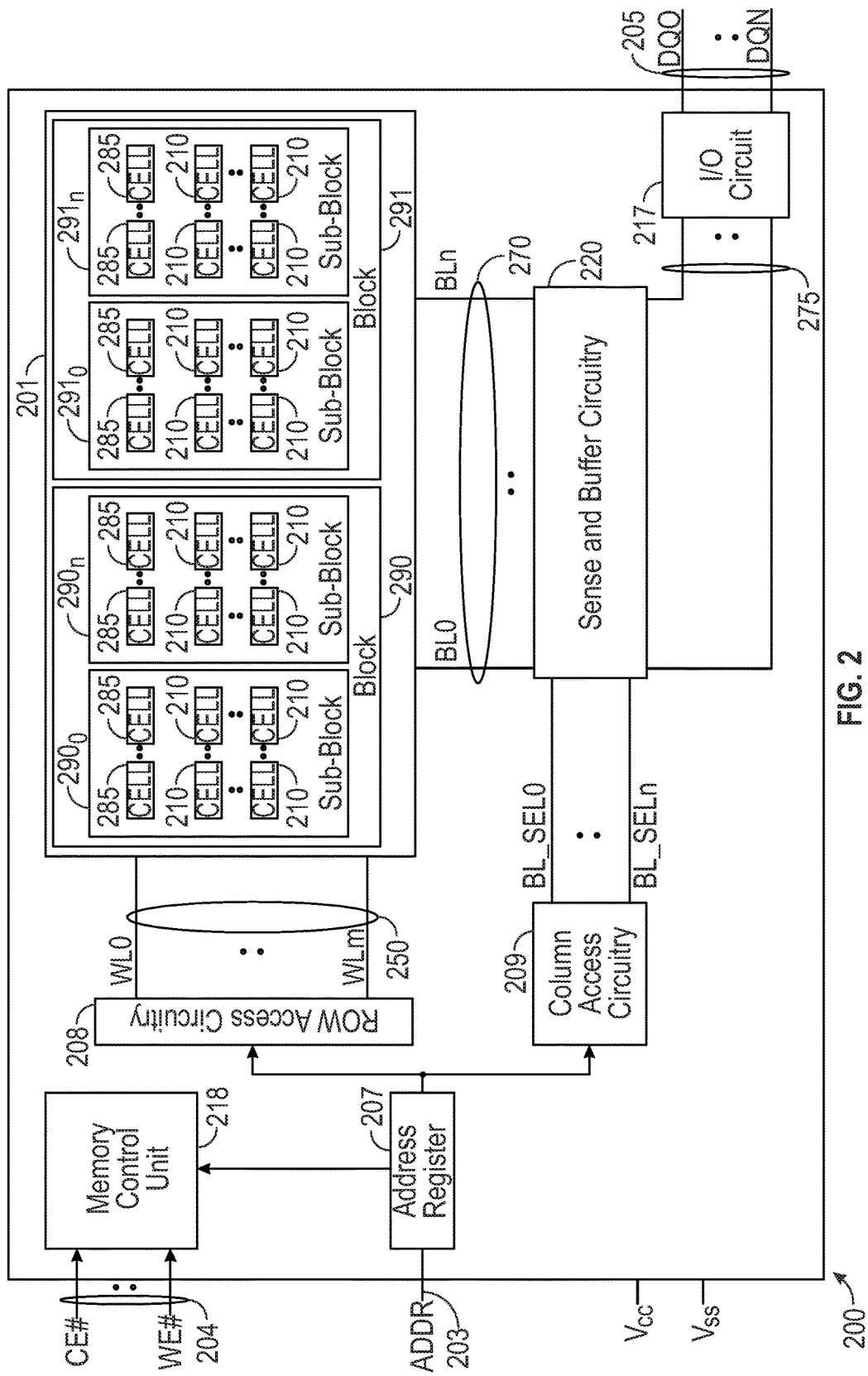
FIG. 2 is a block diagram of an apparatus in the form of a memory device including non-volatile memory cells.

FIG. 2 shows a block diagram of an apparatus in the form of a memory device 200 (e.g., memory device 110 in FIG. 1) including non-volatile memory cells having mixed memory cell types integrated in the same integrated circuit (IC) chip, according to some embodiments described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE#, a write enable signal WE#) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). Memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

Figures 3A, 3B:
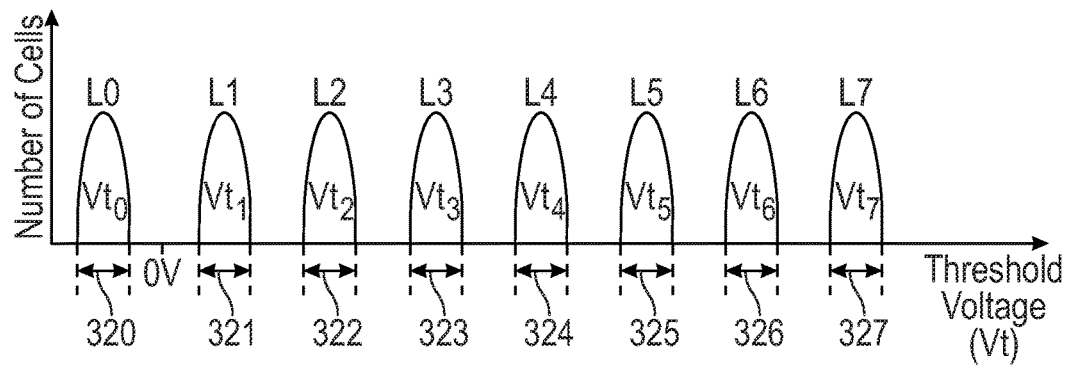
FIG. 3A shows an example of threshold voltage value ranges for multi-level memory cells.
FIG. 3B is an example chart (e.g., a table) showing threshold voltages and corresponding values of bits.

FIG. 3A shows an example of threshold voltage value ranges 320 through 327 of corresponding threshold voltages $Vt_0$ through $Vt_7$ of memory cells 210 and 285 of memory device 200 of FIG. 2, according to some embodiments described herein. Each of memory cells 210 and 285 is configured to store more than one bit of information. FIG. 3A shows an example of threshold voltage value ranges 320 through 327 for memory cells configured to store three bits (e.g., bits B0, B1, and B2) of information. FIG. 3A shows eight levels (level 0 (L0) through level 7 (L7)) corresponding to eight different combinations of three bits. Level L0 can be called an erase level (e.g., erase state). Each of levels L0 through L7 has a threshold voltage value range for a large number of memory cells. Other numbers of bits and levels can be used in the programming (e.g., two bits for four levels, or four bits for sixteen levels).

Each of threshold voltages $Vt_0$ through $Vt_7$ has a value (analog voltage value) within a corresponding threshold voltage value range. For example, threshold voltage $Vt_1$ can be any value (a positive voltage value in volt unit) within threshold voltage value range 321, and threshold voltage $Vt_7$ can be any value (a positive voltage value in volt unit) within threshold voltage value range 327.

As shown in FIG. 3A, the values of threshold voltages $Vt_0$ through $Vt_7$ can go from a value within a lowest value range (threshold voltage value range 320 corresponding to level L0) to a value within a highest threshold voltage value range (threshold voltage value range 327 corresponding to level L7). Thus, the value of threshold voltage $Vt_7$ is greatest among the values of threshold voltages $Vt_0$ through $Vt_7$. The value of each of threshold voltage $Vt_0$ through $Vt_7$ can be used to represent a value (binary value) of a combination of three bits of information. L0 can be considered as an erase level.

FIG. 3B is an example chart (e.g., a table) showing threshold voltages $Vt_0$ through $Vt_7$ (eight different threshold voltages) and corresponding values (eight combinations of binary values) of three bits B0, B1, and B2 according to some embodiments described herein. For example, the values (e.g., in volt units) of threshold voltages $Vt_0$ through $Vt_7$ can be used to represent values (binary values) 000, 001, 010, 011, 100, 101, 110, and 111, respectively, of bits B0, B1, and B2. FIG. 3B shows the values of threshold voltages $Vt_0$ through $Vt_7$ being assigned to (e.g., mapped to) values (000 through 111) of bits B0, B1, and B2 in a sequential order (sequentially from a lower binary value to a higher binary value), as an example. However, the values of threshold voltages $Vt_0$ through $Vt_7$ can be assigned to values of bits B0, B1, and B2 in any order (e.g., non-sequential order). Based on the chart in FIG. 3B, during a write operation, the target value (analog value) for the threshold voltage of a selected memory cell (one of memory cells 210 and 285 in FIG. 2) is based on the value (binary value) of bits B0, B1, and B3 to be stored in that selected memory cell. For example, if three bits (B0, B1, and B2) having a value binary value of "100" are to be stored in the selected memory, then memory device 100 can cause (e.g., program) the threshold voltage of that selected memory cell to be the value of threshold voltage $Vt_4$ ("100"=$Vt_4$ based on the chart in FIG. 3B).

Returning to in FIG. 2, the memory control unit 218 may load a page of data to be programmed in the sense and buffer circuitry 220. The programming algorithm performed by the memory control unit 218 may begin with programming the memory cells to be written to L0 in an erase cycle. Memory cells can be written one memory page at a time or multiple memory pages at a time. Successive programming passes can be used to program the memory cells with data. The first pass may program all the bits to be programmed to L1 (or $Vt_1$). The programming, or placing, of all the L1 bits can be verified before moving on to the L2 bits. For memory cells for which programming to $Vt_1$ could not be verified, the memory controller may try to place an increased $Vt_1$ in these memory cells. This change in $Vt_1$ plus the variation in the memory cells can produce the threshold voltage range of $Vt_1$ shown in FIG. 3A. Programming or placement of the threshold voltage in the cells then progresses through placing the L2 through L7 threshold levels to complete programming the memory cells.

Memory cell disturb occurrences or memory cell defects can cause errors in placement of the threshold voltage of a memory cell. To detect problems in a memory array a two-pass memory programming algorithm can be used.

Figures 4, 5:
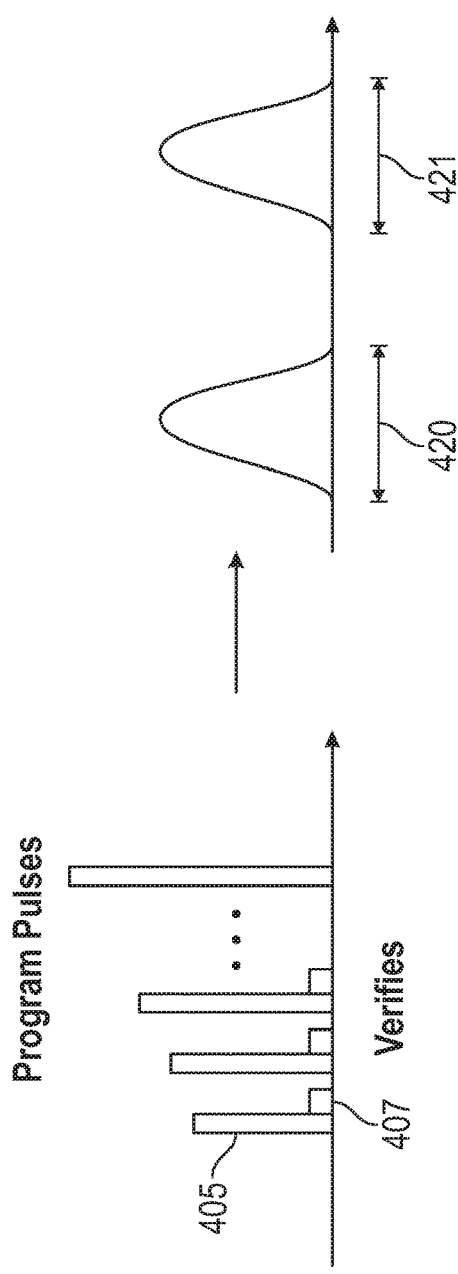
FIG. 4 is an illustration of the first programming pass of a memory programming algorithm.
FIG. 5 is an illustration of the second programming pass of a memory programming algorithm.

FIG. 4 is an illustration of the first programming pass of a memory programming algorithm performed by the memory control unit to place eight voltage thresholds in multi-level memory cells. During the first pass programming, the memory control unit programs lower page (LP) data stored in page buffer circuitry. As shown in FIG. 4, a programming operation includes cycles of program a program pulse 405 followed by a verify operation 407 or read operation. The first pass programming uses programming pulses 405 creates two levels (e.g., L0 and L1) shown as distributions 420 and 421. Also during the first pass, the upper page (UP) data and extended page (XP) data (if used) can be provided to the page buffer circuitry. The second pass programming then creates eight levels of programming of the cells.

FIG. 5 is an illustration of the second programming pass by the programming algorithm. The LP, UP, and XP data are used to program the memory cells to the eight levels. The LP data is already written to the memory cells, so the programming algorithm reads the LP data from the array using a Pre-Read operation 509. The Pre-Read data, the UP data, and XP data are used to create the eight levels 520 through 527 using programming pulses 505 and verify operations 507.

Figure 6:
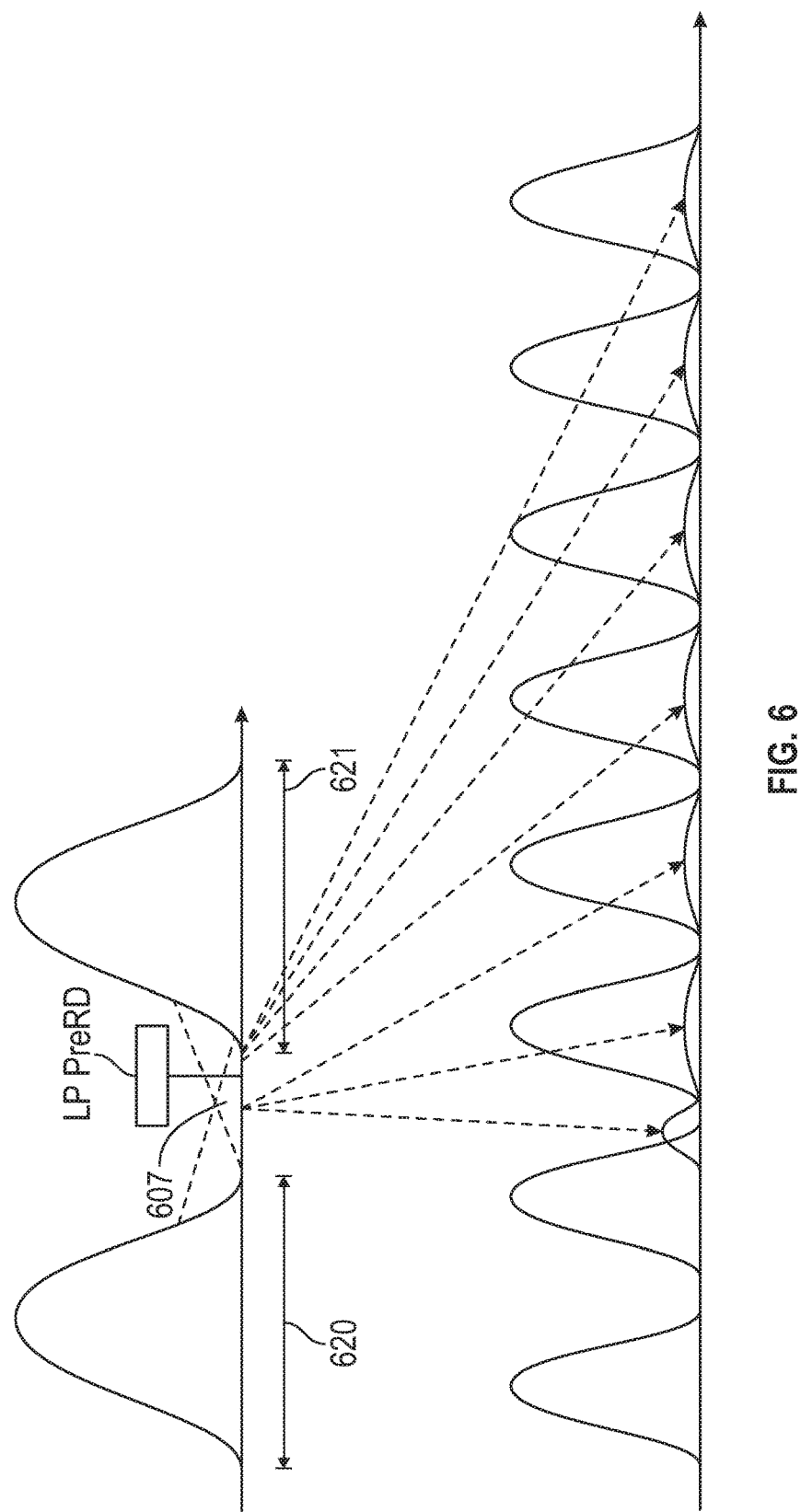
FIG. 6 illustrates misplacement of voltage thresholds by a memory programming algorithm.

FIG. 6 illustrates a problem of misplacement of voltage thresholds by a memory programming algorithm. The top portion of FIG. 6 represents the first pass programming and the bottom portion of FIG. 6 represents the second pass programming. In the top portion, the voltage threshold of a number of cells is placed in the valley between NAND voltage threshold distributions 620 and 621 during the first pass of programming. The misplaced cells may represent an overlap 607 of the lower tail bits of the higher distribution 621 and the upper tail bits of the lower distribution 620. The bottom portion of FIG. 6 illustrates the creation of the eight programming levels of the second pass programming. The misplacement of the voltage thresholds in the valley will be misplaced in the eight levels during the second pass programming. Misplacement is worse than placement in the tails of the distribution (tail bits), because errors due to misplacement are not recoverable using operations such as auto-read calibration, corrective read, or read retry. Misplacement errors also are not detectable using a low density parity check code (LDPC) soft correction engine.

Figure 7:
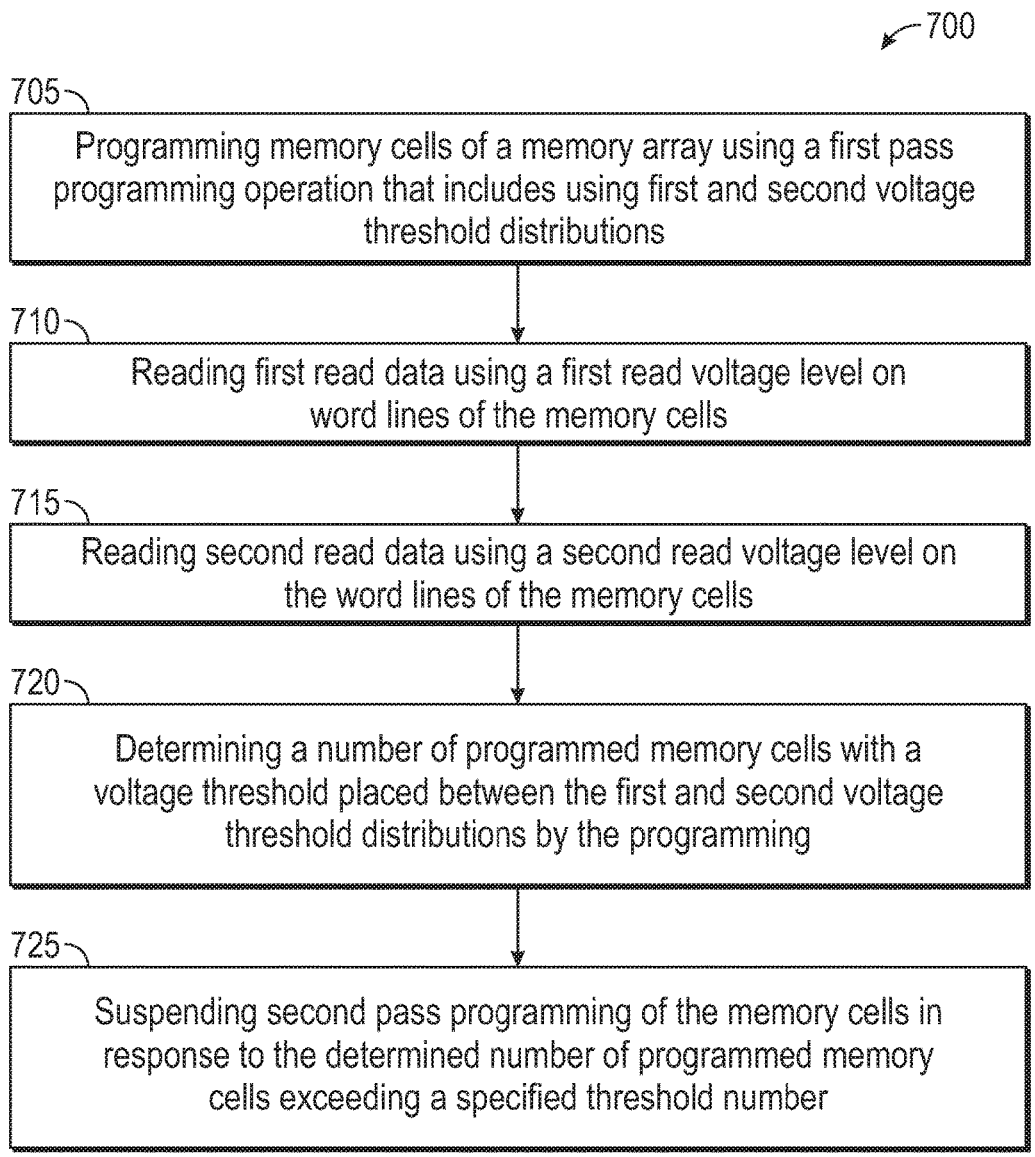
FIG. 7 is a flow diagram of a method of programming multi-level cells of a memory array.

FIG. 7 is a flow diagram of a method 700 of programming multi-level cells of a memory array. The method 700 evaluates the quality of programmed distributions and mitigates misplacement of programmed voltage thresholds. The method 700 includes two pre-reads to determine if there are cells placed in the valley between the distributions placed during the first programming pass. Additional misplacement may occur (e.g., in more than one valley), but it is not necessary to evaluate all of the valleys to determine the quality of the programmed distributions.

At 705 of FIG. 7, the memory control unit programs memory cells of the memory array using a first pass programming operation. The first pass programming operation places programming data (e.g., LP data) using first and second voltage threshold distributions, such as L0 and L1 voltage distributions 620 and 621 in FIG. 6. The second pass programming places data using more than two distributions, such as eight distributions in the example of FIG. 6.

At 710, before the second programming pass, first data is read by placing a first read voltage level on the word lines of the memory cells. At 715, second data is read by placing a second read voltage on the word lines of the memory cells. The voltages placed on the word lines are set to read the valley area between the voltage distributions.

Figure 8:
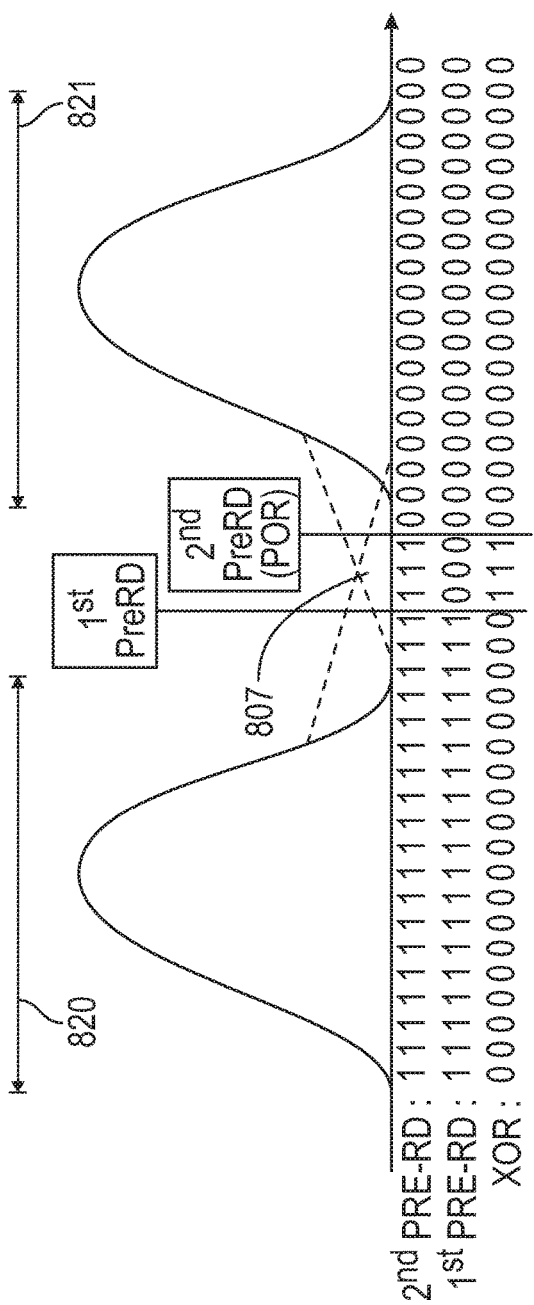
FIG. 8 is an illustration of a method to mitigate misplacement in memory cell programming.

FIG. 8 is an illustration of the method to mitigate misplacement in memory cell programming. The two voltage threshold distributions 820 and 821 of the first pass programming are shown. In the example of FIG. 8, the first pre-read voltage corresponds to a threshold placed nearer the low end of the overlap area 807 and the second pre-read voltage corresponds to a threshold placed nearer the high end of the overlap area 807.

At 720 in FIG. 7, the number of programmed memory cells with a voltage threshold placed between the first and second voltage threshold distributions is determined. This number of cells with a misplaced threshold can be used to evaluate the quality of programmed distributions. In some embodiments, the number of cells misplaced in the overlap is compared to a specified threshold number of cells. Error handling operations may be initiated if the threshold is exceeded.

Figure 9:
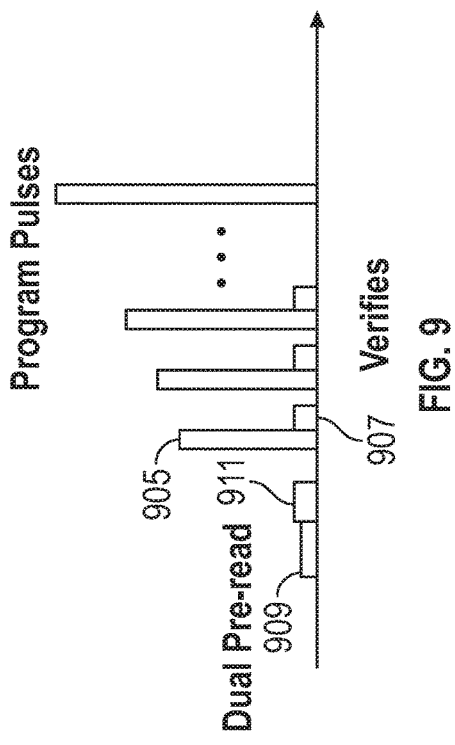
FIG. 9 is an illustration of the dual Pre-Read of the second programming pass of memory programming algorithm.

FIG. 9 is an illustration of the first Pre-Read 909, the second Pre-Read 911 followed by the programing pulses 905 and verify operation 907 of the second programming pass. Returning to FIG. 7 at 725, the second pass programming of the memory cells may be suspended in response to the determined number of programmed memory cells exceeding the specified threshold number. Otherwise, the second pass programming is performed or initiated when the number of misplaced cells is less than the specified number. This specified number of cells can be viewed as a Misplacement Indicator (MI). MI is a low number when the threshold distributions are well separated and the MI increases as the threshold distributions become overlapped. The specified threshold MI number can be trimmable to find a compromise between performance and reliability. Setting the threshold to arbitrarily high number can be used to guarantee that the determined MI will be less than the MI threshold to disable the misplacement mitigation.

Returning to FIG. 8, the two Pre-Read operations can be performed as a double read strobe to reduce the impact on the programming time. The voltage on the word line may be lower for the first read than for the second read. Because the word line voltage is lower, the reads of the misplaced cells in the overlap do not sense the voltage threshold. Therefore the read bits are indicated as "zeros." Because the word line is higher for the second read, the reads of the misplaced cells result in "ones" being read on the cells. This is shown in FIG. 8 below the region of overlap.

The memory control unit may determine the number of misplaced cells (MI) as the number with a placed threshold voltage Vt that satisfies the relation Pre-Read1(V)<Vt<Pre-Read2(V). In some embodiments, the memory control unit determines the number of misplaced cells as the number of cells that conducted using only of the first or the second read voltage and thus the read results are different. In some embodiments, the read data from the first read is stored in a first page buffer (or page buffer area) of the page buffer circuitry of the memory device is stored in a second page buffer (or page buffer area). The memory control unit determines the memory cells with a voltage threshold placed between the first and second voltage threshold distributions as the number of memory cells that have non-matching read data in the buffers. In certain embodiments, the read data is stored in a first data cache and a second data cache of the memory device. As shown in FIG. 8, the number of non-matching cells can be determined using an exclusive-or (XOR) operation. In certain embodiments, the number of non-matching cells can be determined using an XOR operation and a count failure byte (CFByte) operation.

Figure 10:
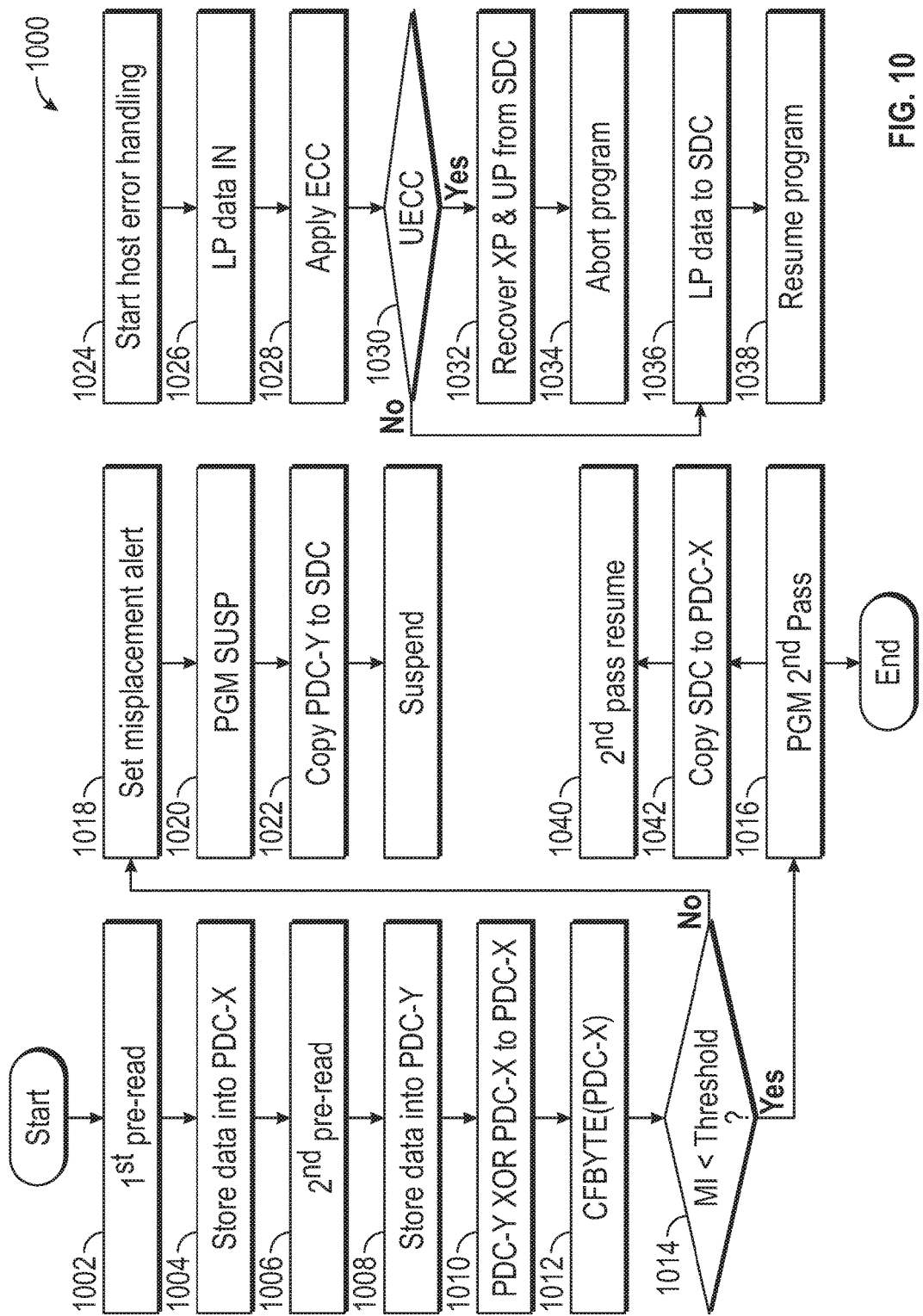
FIG. 10 is a flow diagram of another method of programming multi-level cells of a memory array.

FIG. 10 is a flow diagram of a method 1000 of programming multi-level cells of a memory array to mitigate misplacement of programmed voltage thresholds. At the start of the flow diagram it is assumed that the first programming pass has been completed by the memory device to place lower page (LP) data, and the voltage thresholds of the first programming pass have been placed in the memory cells. The memory cells have a first set of voltage threshold distributions after the first programming pass.

At 1002, the first Pre-Read is performed. At 1004, the read data from the first Pre-Read is stored in a first Primary Data Cache (PDC-X). At 1006, the second Pre-Read is performed. The second read places a different read voltage on the word lines than the first Pre-Read. The second read voltage may be higher than the first read voltage. At 1008, the read data from the second Pre-Read is stored in a second PDC (PDC-Y).

At 1010, an XOR operation is performed on the read data in PDC-X and PDC-Y, and at 1012 a CFByte operation is performed. This determines the number of cells (the mitigation indicator or MI) that satisfy the relation Pre-Read1(V)<Vt<Pre-Read2(V). The MI is compared to a specified number. The specified number may be an acceptable number of cells that have a Vt between the voltage distributions of the first programming pass. If the MI is less than the specified number of cells, the second pass programming is performed at 1016, and the dual pre-read operation ends.

If the MI is not less than the specified number of cells, the number of cells determined to be misplaced is not an acceptable number and a misplacement alert is asserted at 1018. The alert may be asserted by activating a bit in a program status register. At 1020, the second pass of programming is auto-suspended in response to the misplacement alert. At 1022, the read data is moved from the PDC to a Secondary Data Cache (SDC). In certain embodiments, to avoid conflict with cache operations, a Data Ready (RDY) signal may be held low until the alert from the MI is evaluated.

At 1024, the host (e.g., host 105 in FIG. 1) begins error handling operations. As explained above, the LP data is read back out of the memory array for the second pass programming. Because the LP data may be corrupted by the misplacement, the host recovers the LP data for programming using error correction. The host may recognize the misplacement event by checking a status register (SR) that can indicate a misplacement alert. At 1026, the host may manage the misplacement problem by reading out the LP data (e.g., from the SDC) and applying error correction code (ECC) algorithms to the data at 1028.

At 1030, the host error handling determines if the error is uncorrectable (UECC). If the error is uncorrectable, at 1032 the host recovers the extended page (XP) and upper page (UP) data from the SDC. The second pass programming is aborted at 1034. The host may try rewriting the data to a different area of memory. If the error is correctable, at 1036 corrected replacement LP data is loaded the SDC and the host indicates that programming can resume at 1038. At 1040, the memory control unit of the memory device resumes the second pass programming. At 1042, corrected LP data is copied from the SDC to a PDC for programming, and at 1016 the second pass programming is performed.

Even when the determined MI does not exceed a threshold number of cells, the host may retrieve the determined MI and use the MI to assess the condition or the quality of the memory cells or word lines. In some embodiments, host uses the determined MI to change the area of memory to which data is written. In some embodiments, the host may adjust the voltage of the word line when reading the LP data placed by the first pass programming. Changing the word line voltage may allow outliers of the voltage distribution to be read correctly. It can be seen from the embodiments and examples described that using a mitigation indicator to evaluate the quality of programmed distributions and mitigate misplacement of voltage thresholds when programming memory cells leads to improved reliability of memory devices.

Figure 11:
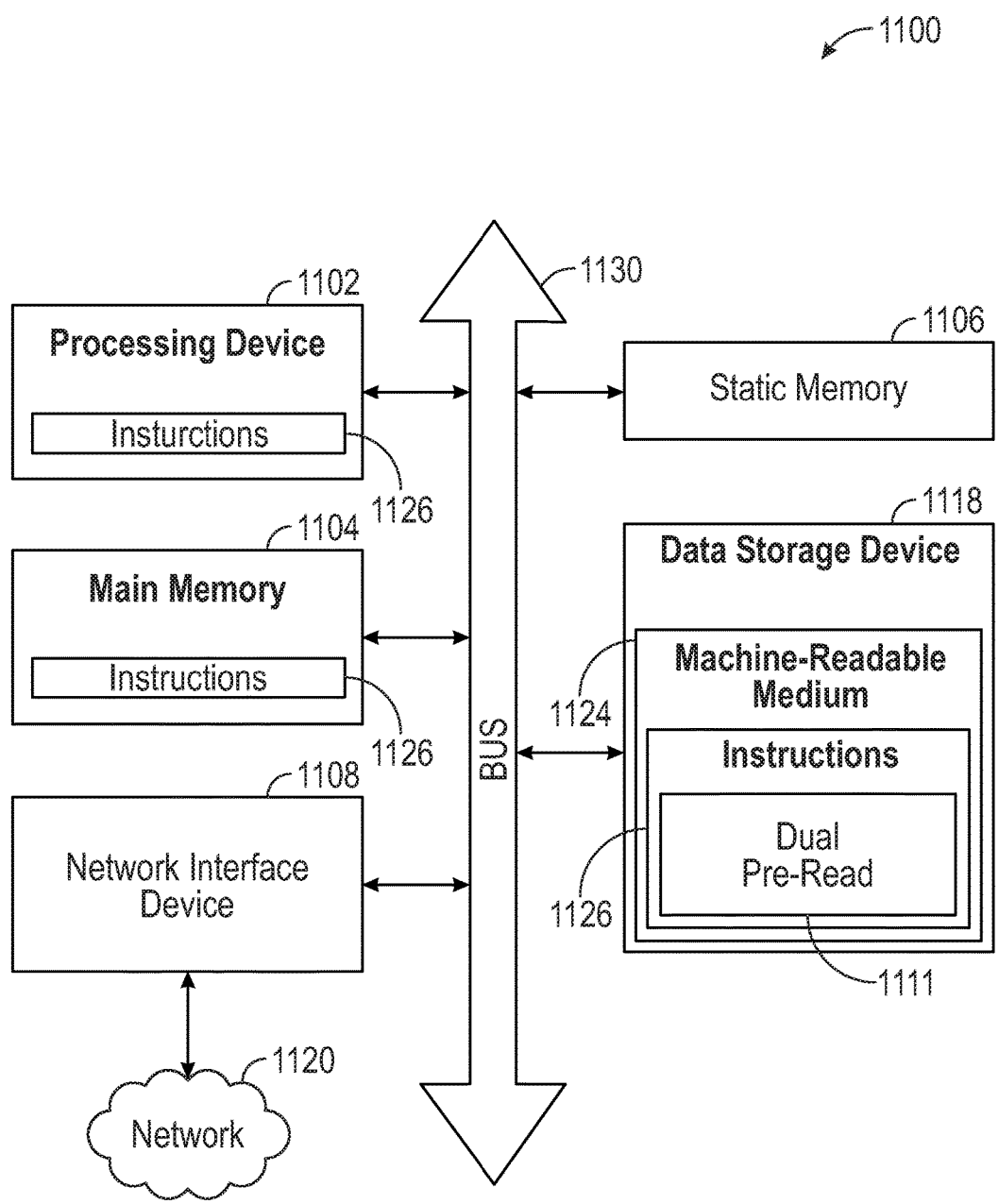
FIG. 11 illustrates a block diagram of an example machine according to some embodiments described herein.

FIG. 11 illustrates a block diagram of an example machine 1100 upon which any one or more of the techniques (e.g., methodologies) discussed herein may perform. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1100 (e.g., the host 105, the memory device 110, etc.) may include a processing device 1102 (e.g., a hardware processor, a central processing unit (CPU), a graphics processing unit (GPU), a hardware processor core, or any combination thereof, such as a memory control unit of the memory device 110, etc.), a main memory 1104 (e.g., read-only memory (ROM), flash memory, dynamic random-access memory (DRAM) such as synchronous DRAM (SDRAM) or Rambus DRAM (RDRAM), etc.), a static memory 1106 (e.g., flash memory, static random-access memory (SRAM), etc.), and a data storage system 1118, some or all of which may communicate with each other via an interlink (e.g., bus) 1130.

The processing device 1102 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), network processor, or the like. The processing device 1102 can be configured to execute instructions 1126 for performing the operations and steps discussed herein. The computer system 1100 can further include a network interface device 1108 to communicate over a network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 or within the processing device 1102 during execution thereof by the computer system 1100, the main memory 1104 and the processing device 1102 also constituting machine-readable storage media. The machine-readable storage medium 1124, the data storage system 1118, or the main memory 1104 can correspond to the memory device 110 of FIG. 1. In one implementation, the instructions 1126 include instructions 1111 to implement functionality corresponding to a dual pre-read during the programming (e.g., the dual pre-read of FIG. 7).

While the machine-readable storage medium 1124 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1100 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1100 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1126 (e.g., software, programs, an operating system (OS), etc.) or other data are stored on the data storage device 1118 can be accessed by the main memory 704 for use by the processing device 1102. The main memory 1104 (e.g., DRAM) is typically fast, but volatile, and thus a different type of storage than the data storage device 1118 (e.g., an SSD), which is suitable for long-term storage, including while in an "off" condition. The instructions 1126 or data in use by a user or the machine 1100 are typically loaded in the main memory 1104 for use by the processing device 1102. When the main memory 1104 is full, virtual space from the data storage device 1118 can be allocated to supplement the main memory 1104; however, because the data storage device 1118 device is typically slower than the main memory 1104, and write speeds are typically at least twice as slow as read speeds, use of virtual memory can greatly reduce user experience due to storage device latency (in contrast to the main memory 1104, e.g., DRAM). Further, use of the data storage device 1118 for virtual memory can greatly reduce the usable lifespan of the data storage device 1118.

In contrast to virtual memory, virtual memory compression (e.g., the Linux™ kernel feature "ZRAM") uses part of the memory as compressed block storage to avoid paging to the data storage device 1118. Paging takes place in the compressed block until it is necessary to write such data to the data storage device 1118. Virtual memory compression increases the usable size of the main memory 1104, while reducing wear on the data storage device 1118.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 1124 may further be transmitted or received over a network 1120 using a transmission medium via the network interface device 1108 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1108 may include one or more physical jacks (e.g., Ethernet, coaxial, or phone jacks) or one or more antennas to connect to the network 1120. In an example, the network interface device 1108 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1100, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

Additional Description and Examples

Example 1 includes subject matter (such as a memory device) comprising a memory array including multi-level memory cells; a memory control unit operatively coupled to the memory array and configured to: initiate programming of memory cells of the memory array using a first pass programming operation, wherein the first pass programming operation places programming data using a first and second voltage threshold distributions; read programmed memory cells using a first read voltage level on word lines of the memory cells; read the programmed memory cells using a second read voltage level on the word lines of the memory cells; determine a number of the programmed memory cells with a voltage threshold placed between the first and second voltage threshold distributions by the programming; and control a second pass programming operation in response to the relation of a specified threshold number and the determined number of programmed memory cells with a voltage threshold placed between the first and second voltage threshold distributions.

In Example 2, the subject matter of Example 1 optionally includes a memory control unit configured to suspend the second pass programming of the memory cells in response to the determined number of programmed memory cells exceeding a specified threshold number; and initiate a second pass programming operation otherwise.

In Example 3, the subject matter of one or both of Examples 1 and 2 optionally includes a memory control unit configured to determine a number of memory cells that conducted using only one of the first read voltage or the second read voltage level as the number of the multi-level memory cells with a voltage threshold placed between the first and second voltage threshold distributions.

In Example 4, the subject matter of one or nay combination of Examples 1-3 optionally includes a first page buffer and a second page buffer, and a memory control unit configured to store first data read using the first read voltage level in the first buffer; store second data read using the second read voltage level in the second buffer; and determine a number of memory cells that have non-matching first data and second data in the first and second buffers as the number of the multi-level memory cells with a voltage threshold placed between the first and second voltage threshold distributions.

In Example 5, the subject matter of one or any combination of Examples 1-4 optionally includes a memory control unit configured to change the programming data to replacement data in response to the determined number of cells exceeding the specified threshold number; and initiate a second pass programming operation using the replacement data.

In Example 6, the subject matter of one or any combination of Examples 1-5 optionally includes a memory control unit configured to: transfer first data that is read using the first read voltage level to a host application; receive replacement data from the host application in response to the determined number of cells exceeding the specified threshold number; and initiate a second pass programming operation using the replacement data.

In Example 7, the subject matter of one or any combination of Examples 1-6 optionally includes second pass programming that places the programming data using more voltage threshold distributions than the first pass programming.

Example 8 includes subject matter (such as a method of programming multi-level memory cells of a memory array), or can optionally be combined with one or any combination of Examples 1-7 to include such subject matter comprising: programming memory cells of the memory array using a first pass programming operation, wherein the first pass programming operation places programming data using first and second voltage threshold distributions; reading first read data using a first read voltage level on word lines of the memory cells; reading second read data using a second read voltage level on the word lines of the memory cells; determining a number of programmed memory cells with a voltage threshold placed between the first and second voltage threshold distributions by the programming; and controlling a second pass programming operation in response to the relation of a specified threshold number and the determined number of programmed memory cells with a voltage threshold placed between the first and second voltage threshold distributions.

In Example 9, the subject matter or Example 8 optionally includes suspending second pass programming of the memory cells in response to the determined number of programmed memory cells exceeding a specified threshold number; and performing the second pass programming otherwise.

In Example 10, the subject matter of one or both of Examples 8 and 9 optionally includes determining a number of memory cells that conducted using only one of the first read voltage or the second read voltage level.

In Example 11, the subject matter of one or any combination of Examples 8-10 optionally includes storing the first read data in a first buffer; and storing the second read data in a second buffer. The determining the number of programmed memory cells optionally includes determining the number of memory cells that have non-matching first read data and second read data in the first and second buffers.

In Example 12, the subject matter of one or any combination of Examples 8-11 optionally includes changing the programming data to replacement data in response to the determined number of programmed memory cells exceeding the specified threshold number; and performing a second pass programming operation using the replacement data.

In Example 13, the subject matter of Example 12 optionally includes reading the first read data using a host application in response to the determined number of cells exceeding the specified threshold number; applying error correction to the first read data to generate the replacement data; and loading the replacement data into a page buffer for programming.

In Example 14, the subject matter of one or both of Examples 12 and 13 optionally includes transferring the programming data from a page buffer to a cache buffer in response to the determined number of cells exceeding the specified threshold number; generating the replacement data using data in the cache buffer; storing the replacement data in the page buffer; and performing the second pass programming operation using the replacement data stored in the page buffer.

In Example 15, the subject matter of one or any combination of Examples 8-14 optionally includes programming the memory cells using a second pass programming operation in response to the determined number of cells being less than or equal to the specified number of cells, wherein the second pass programming operation includes more than two voltage threshold distributions.

In Example 16, the subject matter of one or any combination of Examples 8-15 optionally includes reading the first read data using a host application in response to the determined number of cells exceeding the specified threshold number; applying error correction to the first read data using the host application; and aborting the second pass programming of the multi-level memory cells in response to the error correction being unsuccessful.

Example 17 includes subject matter (such as a non-transitory computer readable storage medium) or can optionally be combined with one or more of Examples 1-16 to include such subject matter, comprising instructions configured to cause a memory control unit of a memory device to: program memory cells of the memory array using a first pass programming operation, wherein the first pass programming operation includes two voltage threshold distributions; initiate a first read operation using a first read voltage level on word lines of the memory cells; initiate a second read operation using a second read voltage level on the word lines of the memory cells; determine a number of the multi-level memory cells with a programmed voltage threshold between the two voltage threshold distributions; and suspend second pass programming of the memory cells in response to the determined number of memory cells exceeding a specified threshold number, and performing the second pass programming otherwise.

In Example 18, the subject matter of Example 17 optionally includes instructions configured to cause the memory control unit to determine a number of memory cells that conducted using only one of the first read voltage or the second read voltage level as the number of memory cells with a programmed voltage threshold between the two voltage threshold distributions.

In Example 19, the subject matter of one or both of Examples 17 and 18 optionally includes instructions to cause the memory control unit to: store first read data determined using the first read voltage in a first buffer of the memory device; store second read data determined using the second read voltage in a second buffer of the memory device; and determine the number of memory cells that have non-matching first read data and second read data in the first and second buffers as the number of memory cells with a programmed voltage threshold between the two voltage threshold distributions.

In Example 20, the subject matter of one or any combination of Examples 17-19 optionally includes instructions to cause the memory control unit to: change the programming data to replacement data in response to the determined number of cells exceeding the specified threshold number; and initiate a second pass programming operation using the replacement data.

In Example 21, the subject matter of one or any combination of Examples 17-20 optionally includes instructions to cause the memory control unit to: transfer programming data to a host application in response to suspending second pass programming of the memory cells; receive replacement data from a host application; and load the replacement data into a page buffer of the memory device for the second pass programming.

In Example 22, the subject matter of one or any combination of Examples 17-21 optionally includes instructions configured to cause the memory control unit to program the memory cells using a second pass programming operation in response to the determined number of memory cells being less than or equal to the specified number of memory cells, wherein the second pass programming operation includes more than two voltage threshold distributions.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
    a memory array including multi-level memory cells;
    a memory control unit operatively coupled to the memory array and configured to:
    initiate programming of memory cells of the memory array using a first pass programming operation, wherein the first pass programming operation places programming data using first and second voltage threshold distributions;
    perform a first read operation of programmed memory cells using a first read voltage level on word lines of the memory cells;
    perform a second read operation of the same programmed memory cells using a second read voltage level on the word lines of the memory cells;
    determine a number of the programmed memory cells with a voltage threshold placed between the first and second voltage threshold distributions by the programming using the first and second read operations; and
    control a second pass programming operation in response to the relation of a specified threshold number and the determined number of programmed memory cells with a voltage threshold placed between the first and second voltage threshold distributions.

2. The memory device of claim 1, wherein the memory control unit is configured to:
    suspend the second pass programming of the memory cells in response to the determined number of programmed memory cells exceeding a specified threshold number; and
    initiate a second pass programming operation otherwise.

3. The memory device of claim 1, wherein the memory control unit is configured to determine a number of memory cells that conducted using only one of the first read voltage or the second read voltage level as the number of the multi-level memory cells with a voltage threshold placed between the first and second voltage threshold distributions.

4. The memory device of claim 1, including:
    a first page buffer and a second page buffer;
    wherein the memory control unit is configured to:
    store first data read using the first read voltage level in the first buffer;
    store second data read using the second read voltage level in the second buffer; and
    determine a number of memory cells that have non-matching first data and second data in the first and second buffers as the number of the multi-level memory cells with a voltage threshold placed between the first and second voltage threshold distributions.

5. The memory device of claim 1, wherein the memory control unit is configured to:
    change the programming data to replacement data in response to the determined number of cells exceeding the specified threshold number; and
    initiate a second pass programming operation using the replacement data.

6. The memory device of claim 1, wherein the memory control unit is configured to:

transfer first data that is read using the first read voltage level to a host application;

receive replacement data from the host application in response to the determined number of cells exceeding the specified threshold number; and initiate a second pass programming operation using the replacement data.

7. The memory device of claim 1, wherein the second pass programming programs more bits into the memory cell than the first pass programming.

8. A method of programming multi-level memory cells of a memory array, the method comprising:

programming memory cells of the memory array using a first pass programming operation, wherein the first pass programming operation places programming data using first and second voltage threshold distributions;

reading first read data using a first read voltage level on word lines of the programmed memory cells;

reading second read data using a second read voltage level on the word lines of the programmed memory cells;

determining a number of programmed memory cells with a voltage threshold placed between the first and second voltage threshold distributions by the programming using the first and second read data read from the same programmed memory cells; and controlling a second pass programming operation in response to the relation of a specified threshold number and the determined number of programmed memory cells with a voltage threshold placed between the first and second voltage threshold distributions.

9. The method of claim 8, wherein controlling the second pass programming operation includes:

suspending second pass programming of the memory cells in response to the determined number of programmed memory cells exceeding a specified threshold number; and performing the second pass programming otherwise.

10. The method of claim 8, wherein the determining the number of programmed memory cells with a voltage threshold placed between the first and second voltage threshold distributions includes determining a number of memory cells that conducted using only one of the first read voltage or the second read voltage level.

11. The method of claim 8, including:

storing the first read data in a first buffer; and storing the second read data in a second buffer;

wherein the determining the number of programmed memory cells with a voltage threshold placed between the first and second voltage threshold distributions includes determining the number of memory cells that have non-matching first read data and second read data in the first and second buffers.

12. The method of claim 8, including:

changing the programming data to replacement data in response to the determined number of programmed memory cells exceeding the specified threshold number; and performing a second pass programming operation using the replacement data.

13. The method of claim 12, wherein changing the programming data to replacement data includes:

reading the first read data using a host application in response to the determined number of cells exceeding the specified threshold number;

applying error correction to the first read data to generate the replacement data; and loading the replacement data into a page buffer for programming.

14. The method of claim 12, wherein reading the first read data using a host application includes:

transferring the programming data from a page buffer to a cache buffer in response to the determined number of cells exceeding the specified threshold number;

generating the replacement data using data in the cache buffer;

storing the replacement data in the page buffer; and performing the second pass programming operation using the replacement data stored in the page buffer.

15. The method of claim 8, including programming the memory cells using a second pass programming operation in response to the determined number of cells being less than or equal to the specified number of cells, wherein the second pass programming operation programs the memory cells with more bits than the first programming pass.

16. The method of claim 8, including:

reading the first read data using a host application in response to the determined number of cells exceeding the specified threshold number;

applying error correction to the first read data using the host application; and aborting the second pass programming of the multi-level memory cells in response to the error correction being unsuccessful.

17. A non-transitory computer readable storage medium comprising instructions configured to cause a memory control unit of a memory device to:

program memory cells of the memory array using a first pass programming operation, wherein the first pass programming operation includes two voltage threshold distributions;

initiate a first read operation using a first read voltage level on word lines of the memory cells;

initiate a second read operation using a second read voltage level on the word lines of the same memory cells as the first read operation;

determine a number of the multi-level memory cells with a programmed voltage threshold between the two voltage threshold distributions using read data read using the first and second read operations; and suspend second pass programming of the memory cells in response to the determined number of memory cells exceeding a specified threshold number, and performing the second pass programming otherwise.

18. The non-transitory computer readable storage medium of claim 17, further including instructions configured to cause the memory control unit to determine a number of memory cells that conducted using only one of the first read voltage or the second read voltage level as the number of memory cells with a programmed voltage threshold between the two voltage threshold distributions.

19. The non-transitory computer readable storage medium of claim 17, further including instructions configured to cause the memory control unit to:

store first read data determined using the first read voltage in a first buffer of the memory device;

store second read data determined using the second read voltage in a second buffer of the memory device; and determine the number of memory cells that have non-matching first read data and second read data in the first and second buffers as the number of memory cells with a programmed voltage threshold between the two voltage threshold distributions.

20. The non-transitory computer readable storage medium of claim 17, further including instructions configured to cause the memory control unit to:
- change the programming data to replacement data in response to the determined number of cells exceeding the specified threshold number; and
- initiate a second pass programming operation using the replacement data.

21. The non-transitory computer readable storage medium of claim 17, further including instructions configured to cause the memory control unit to:
- transfer programming data to a host application in response to suspending second pass programming of the memory cells;
- receive replacement data from a host application; and
- load the replacement data into a page buffer of the memory device for the second pass programming.

22. The non-transitory computer readable storage medium of claim 17, further including instructions configured to cause the memory control unit to program the memory cells using a second pass programming operation in response to the determined number of memory cells being less than or equal to the specified number of memory cells, wherein the second pass programming operation programs the memory cells with more bits than the first programming pass.

* * * * *